United States Patent
Liu et al.

(10) Patent No.: US 12,550,301 B2
(45) Date of Patent: Feb. 10, 2026

(54) IMMERSION COOLING DEVICE

(71) Applicant: Fulian Precision Electronics (Tianjin) Co., LTD., Tianjin (CN)

(72) Inventors: Tsung-Lin Liu, Neihu (TW); Chun-Wei Lin, New Taipei (TW); Chia-Nan Pai, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 200 days.

(21) Appl. No.: 18/520,111

(22) Filed: Nov. 27, 2023

(65) Prior Publication Data

US 2024/0381587 A1 Nov. 14, 2024

(30) Foreign Application Priority Data

May 11, 2023 (CN) .......................... 202321129400.3

(51) Int. Cl.
*H05K 7/20* (2006.01)

(52) U.S. Cl.
CPC ......... *H05K 7/20809* (2013.01); *H05K 7/203* (2013.01); *H05K 7/20318* (2013.01); *H05K 7/20336* (2013.01); *H05K 7/20309* (2013.01)

(58) Field of Classification Search
CPC ............... H05K 7/203; H05K 7/20318; H05K 7/20327; H05K 7/20236; H05K 7/20381; H05K 7/20836; H05K 7/20272; G06F 1/20; G06F 2200/201; H01L 23/44; F28F 2280/10; F28D 15/02; F28D 2021/0028
See application file for complete search history.

(56) References Cited

U.S. PATENT DOCUMENTS

| | | | |
|---|---|---|---|
| 10,765,033 B1 * | 9/2020 | Keehn | H05K 7/20318 |
| 2017/0112017 A1 * | 4/2017 | Wang | H05K 7/20236 |
| 2021/0153386 A1 * | 5/2021 | Lau | B66C 23/346 |
| 2021/0410320 A1 * | 12/2021 | Yang | H05K 7/20818 |
| 2022/0369493 A1 * | 11/2022 | Alissa | H05K 7/20818 |
| 2023/0073646 A1 * | 3/2023 | Gao | H05K 7/20818 |
| 2023/0217630 A1 * | 7/2023 | Gao | H05K 7/20818 |
| | | | 361/699 |

FOREIGN PATENT DOCUMENTS

CN 111692826 A * 9/2020 .......... F25D 25/025

OTHER PUBLICATIONS

CN 111692826 translation (Year: 2020).*

* cited by examiner

Primary Examiner — Mandeep S Buttar
(74) Attorney, Agent, or Firm — ScienBiziP, P.C.

(57) ABSTRACT

An immersion cooling device includes a box body containing coolant, a heat-generating component received in the box body and immersed in the coolant, a slide rail received in the box body, fixed to the box body and located above the coolant, a condenser slidably disposed on the slide rail, a cover body adapted to cover the box body and to be opened relative to the box body, and an inlet pipe connected to the condenser and passing through and sealed from the cover body.

13 Claims, 5 Drawing Sheets

IMMERSION COOLING DEVICE

FIELD

The subject matter herein generally relates to the field of heat dissipation technologies, and in particular, to an immersion cooling device.

BACKGROUND

In an immersion cooling device, a service is immersed in coolant, the coolant absorbs heat generated by the service and is gasified and evaporates. Vaporized coolant condenses on a condenser, and the coolant condensed on the condenser flows back into the coolant, thereby achieving heat dissipation. The condenser is usually fixed on a side wall of a box body containing the coolant, and the vaporized coolant must diffuse to the condenser at the side wall.

BRIEF DESCRIPTION OF THE DRAWINGS

Implementations of the present technology will now be described, by way of embodiment, with reference to the attached figures.

DETAILED DESCRIPTION

Figure 1:
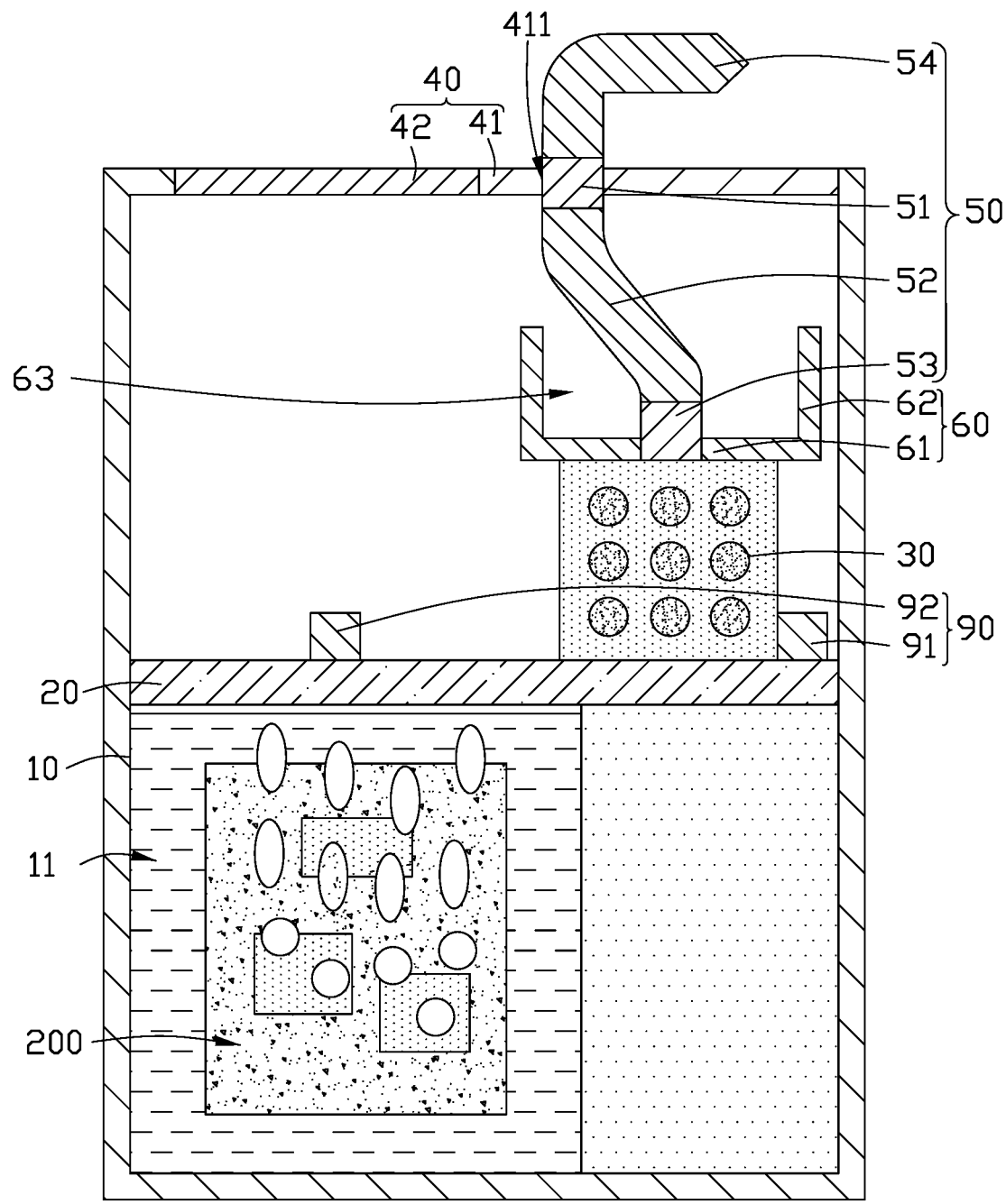
FIG. 1 is a cross section view of an embodiment of an immersion cooling device according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "connected" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

First Embodiment

Figure 2:
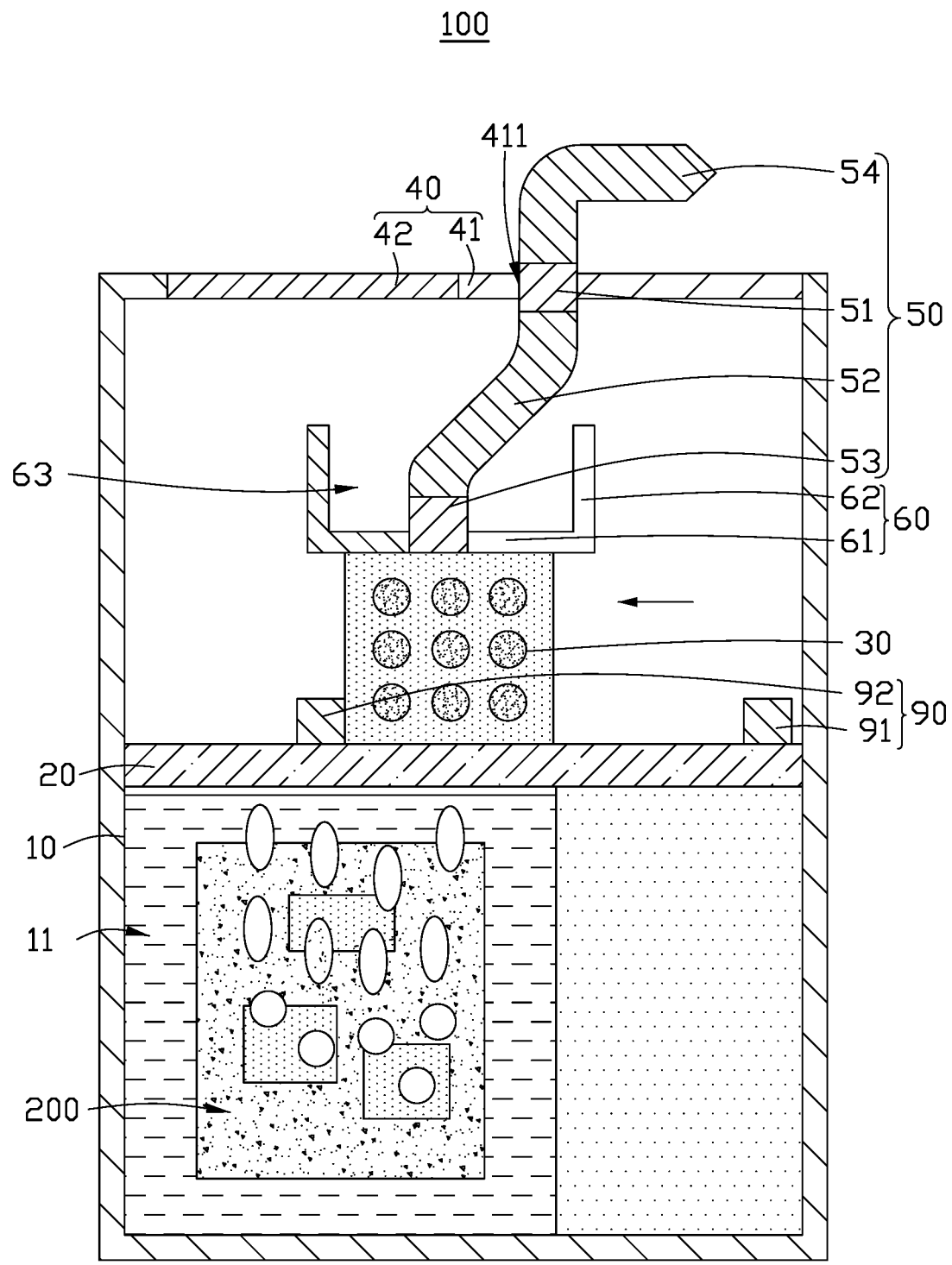
FIG. 2 is a cross section view showing a condenser of the immersion cooling device of FIG. 1 moving from a first limit block to a second limit block.

Referring to FIG. 1 and FIG. 2, an embodiment of an immersion cooling device 100 is illustrated. The immersion cooling device 100 is configured to cool a heat-generating component 200. The heat-generating component 200 may a server, a resistance wire, etc. The immersion cooling device includes a box body 10, a slide rail 20, a condenser 30, a cover body 40, an inlet pipe 50, and an outlet pipe (not shown). The box body 10 contains a coolant 11, and a plurality of heat-generating components 200 are immersed in the coolant 11. The condenser 30 is located inside the box body 10 and is located above or on one side of the coolant 11. Heat generated by the heat-generating components 200 is transferred to the coolant 11, the coolant 11 is heated and evaporated, vaporized coolant condenses on the condenser 30, and the coolant condensed on the condenser falls back into the coolant, thereby achieving heat dissipation.

Referring to FIG. 1 and FIG. 2, the slide rail 20 is fixed on an inner wall of the box body 10 and is located above the coolant 11. The condenser 30 is slidably disposed on the slide rail 20. In the immersion cooling device 100, a position of the condenser 30 on the slide rail 20 can be adjusted according to heat generating positions of the heat-generating components 200, so that condenser 30 can be located at a more optimal position of the heat-generating components 200. For example, the condenser 30 is located directly above the heat-generating components 200. So that when the coolant absorbs heat generated by the heat-generating components 200 and is gasified and evaporates, the vaporized coolant can be quickly diffused to condenser 30, improving the cooling efficiency. In a subsequent process of repairing the heat-generating components 200, the condenser 30 can slide along the slide rail to adjust a position according to a required repair position of the heat-generating components 200, reducing the risk of damage to the condenser 30. The cover body 40 is mounted on a side of the box body 10 and covers and seals the box body 10. The condenser 30 is received in the box body 10 and located between the cover body 40 and the coolant 11. The inlet pipe 50 and the outlet pipe are connected to the condenser 30, penetrate through the cover body 40, and are sealed from and connected to the cover body 40, preventing the vaporized coolant from escaping from the box body 10. The inlet pipe 50 and the outlet pipe are the same.

In some embodiments, the slide rail 20 is fixed on the inner wall of the box body 10 by welding or bolts. The slide rail 20 supports the condenser 30, and the condenser 30 can slides along the slide rail 20. In some embodiments, there are two slide rails 20 mounted on two opposite inner walls of the box body 10, and the two slide rails 20 will not hinder the removal and placement of the heat-generating components 200. In some embodiments, the box body 10 is substantially rectangular. In some embodiments, a plurality of heat-generating components 200 which is arranged as a matrix are disposed in the box body 10, and the slide rails 20 are located above the coolant 11.

Referring to FIG. 1 and FIG. 2, in some embodiments, the cover body 40 includes a first portion 41 fixed to the box body 10 and a second portion 42 connected to the first portion 41. The second portion 42 can be opened relative to the first portion 41. The first portion 41 defines a through hole 411. The inlet pipe 50 includes a first rigid pipe 51 and a first flexible pipe 52. The first rigid pipe 51 extends through the through hole 411 and fixed to the first portion 41, so that the inlet pipe 50 is fixed to the cover body 40 through the first rigid pipe 51. An end of the flexible pipe 52 is connected to the rigid pipe 51, and another end of the flexible pipe 52 is connected to the condenser 30. A length of the first flexible pipe 52 is greater than a distance between the condenser 30 and the first portion 41. When it is necessary to remove or repair the heat-generating device 200 in the immersion cooling device 100, the second portion 42 will be opened relative to the first portion 41, and the condenser 30 is pushed, by a user, to move along the slide rail 20, the first flexible pipe 52 is stretched and moves with the condenser 30, so that a position of the condenser 30 can be adjusted. Since the length of the first flexible pipe 52 is greater than the distance between the condenser 30 and the first portion 41, the condenser 30 can be pushed to move along the slide rail 20 without the limiting of the first flexible pipe 52, avoiding damage to the first flexible pipe 52 due to excessive stretching.

In some embodiments, the first portion 41 and the box body 10 are formed as an integral unit, and the second portion 42 is hinged on the first portion 41. In other embodiments, the second portion 42 is engaged with an opening surrounded by the box body 10 and the first portion 41. The first rigid pipe 51 is fixed in the through hole 411 by welding or adhesives. A silicone pad (not shown) is disposed on the connection between the first portion 41 and the second portion 42, increasing the sealing between the first portion 41 and the second portion 42, and preventing the vaporized coolant from escaping from the connection between the first portion 41 and the second portion 42. In some embodiments, the first portion 41 and the second portion 42 are both plate-shaped. For example, the first portion 41 and the second portion 42 are rectangular plates.

In some embodiments, the inlet pipe 50 further includes a second rigid pipe 53. The first flexible pipe 52 is connected to the condenser 30 through the second rigid pipe 53. The second rigid pipe 53 is fixedly connected to the condenser 30.

Referring to FIG. 1 and FIG. 2, the immersion cooling device 100 further includes a liquid collector 60. The liquid collector 60 is sleeved on the inlet pipe 50 and the outlet pipe and is configured to collect liquid leaked from the inlet pipe 50 or the outlet pipe, so as to prevent liquid in the inlet pipe 50 or the outlet pipe from flowing into the coolant in the box body 10 when the inlet pipe 50 or the outlet pipe ruptures. When the inlet pipe 50 or the outlet pipe ruptures due to pressure difference between the inside and outside of the inlet pipe 50 or the outlet pipe, liquid in the inlet pipe 50 or the outlet pipe will leak into the liquid collector 60. In some embodiments, the liquid collector 60 is sleeved on the second rigid pipe 53. The liquid collector 60 includes a bottom plate 61 and a plurality of side plates 62 disposed on the bottom plate 61. The bottom plate 61 and the side plates 62 enclose a collecting chamber 63 with an opening. The second rigid pipe 53 extends through the bottom plate 61 and is connected to the condenser 30, and a portion of the second rigid pipe 53 and a portion of the first flexible pipe 52 are received in the collecting chamber 63, so that liquid leaked from the first flexible pipe 52 will be easily collected in the collecting chamber 63.

In some embodiments, the inlet pipe 50 further includes a second flexible pipe 54. The second flexible pipe 54 is connected to the first rigid pipe 51 and is located outside the box body 10.

In some embodiments, a sliding block (not shown) is disposed on the bottom of the condenser 30, and the condenser 30 is slidably connected to the slide rail 20 through the sliding block. In other embodiments, a support plate is disposed on the bottom of the condenser 30, and the sliding block is fixed on the support plate.

Referring to FIG. 1 and FIG. 2, a stop block 90 is disposed on the slide rail 20. The stop block 90 is fixed to the slide rail 20 and is configured to limit a moving range of the condenser 30 on the slide rail 20. When the condenser 30 is pushed to slide along the slide rail 20, the condenser 30 will be stopped by the stop block 90, protecting the first flexible pipe 52 from being excessively stretched during sliding, and reducing the risk of the condenser 30 colliding with the inner wall of the box body 10. The stop block 90 includes a first stop block 91 and a second stop block 92 which are fixed on the same slide rail 20. The condenser 30 slides between the first stop block 91 and the second stop block 92 on the slide rail 20. For example, the first stop block 91 is located at a first end of the slide rail 20, the second stop block 92 is located at one-third of the total length of the slide rail 20 from the first end, and the sliding range of the condenser 30 is located two-thirds of the total length of the slide rail 20. In this case, the condenser 30 will not collide with the inner wall of the shell 10 during sliding, and the first flexible pipe 52 will not be excessively stretched when the condenser 30 is located at a more optimal position.

In some embodiments, the first flexible pipe 52 is a metal hose or a rubber hose.

Figure 3:
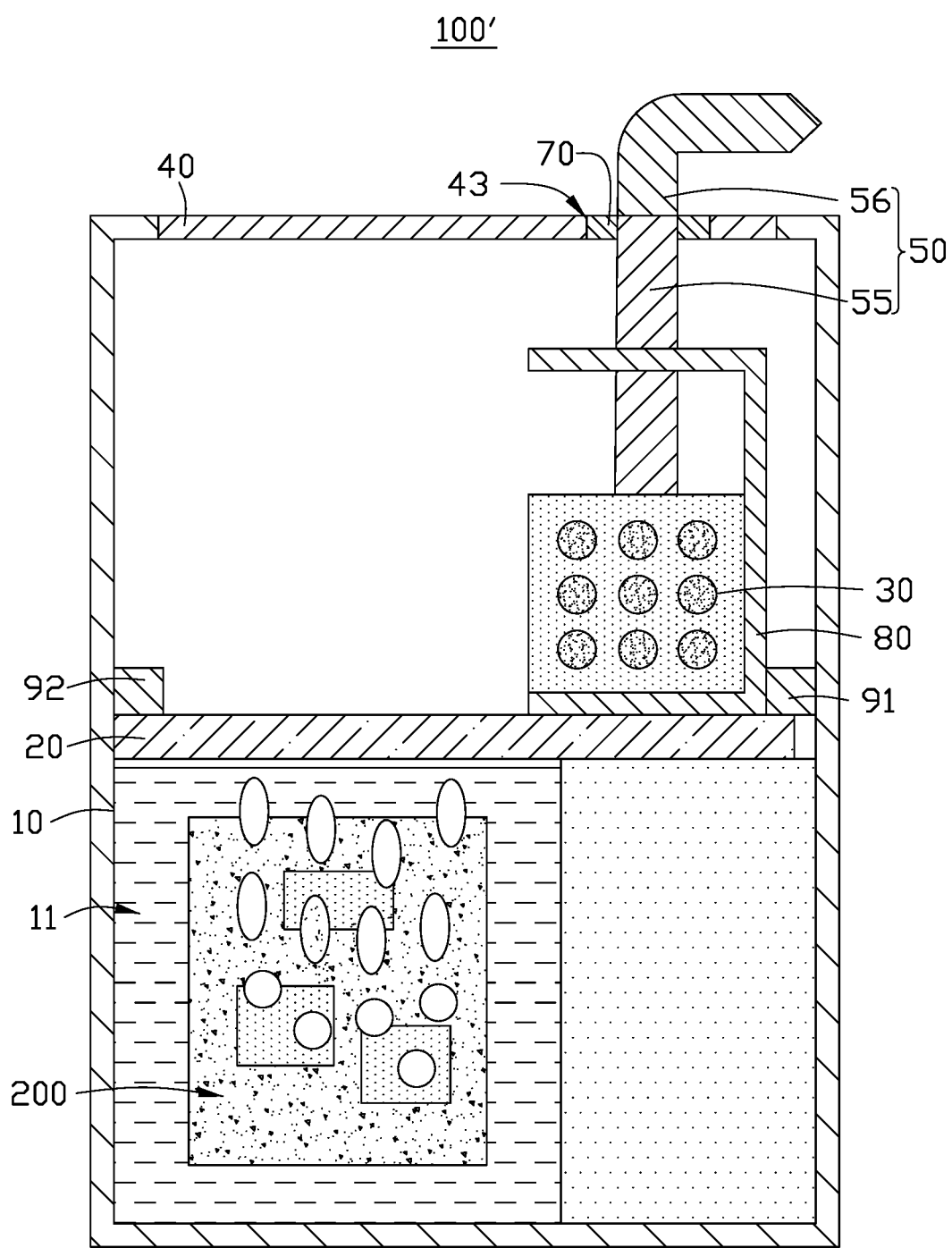
FIG. 3 is a cross section view of another embodiment of an immersion cooling device according to the present disclosure.

Referring to FIG. 3, in some embodiments, the immersion cooling device 100 further includes a protective frame 80. The condenser 30 is mounted on the protective frame 80, and the protective frame 80 is slidably mounted on the slide rail 20. In this case, the condenser 30 is slidably connected to the slide rail 20 through the protective frame 80. When the condenser 30 slides along the slide rail 20 under an external force, the external force is directly applied to the protective frame 80, and the condenser 30 is moved with the protective frame 80, reducing damage to the condenser 30 during sliding.

Second Embodiment

The difference between the first embodiment and the second embodiment is structures of the cover body 40 and the inlet pipe 50.

Figure 4:
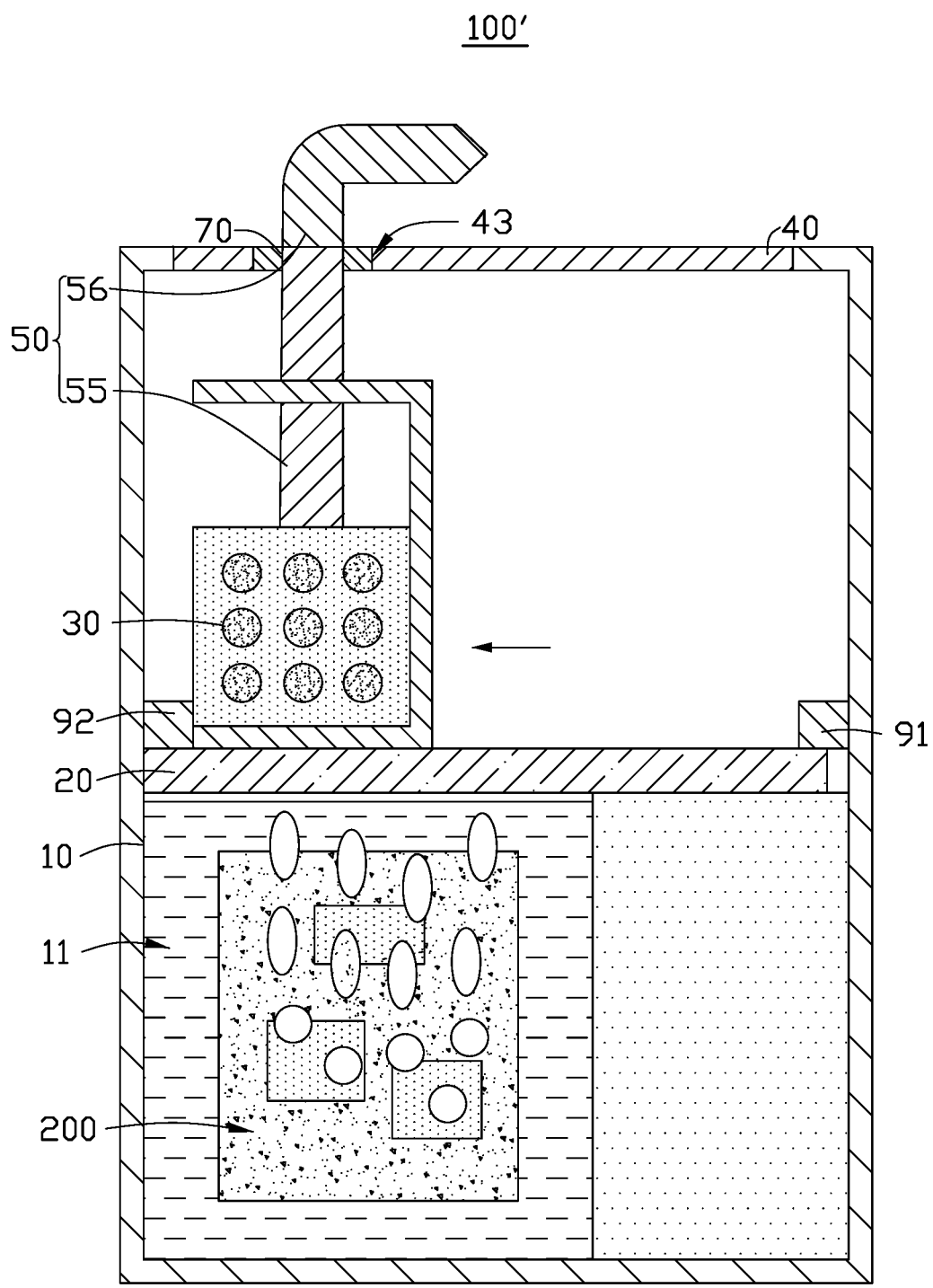
FIG. 4 is a cross section view showing a condenser of the immersion cooling device of FIG. 3 moving from a first position to a second position.
Figure 5:
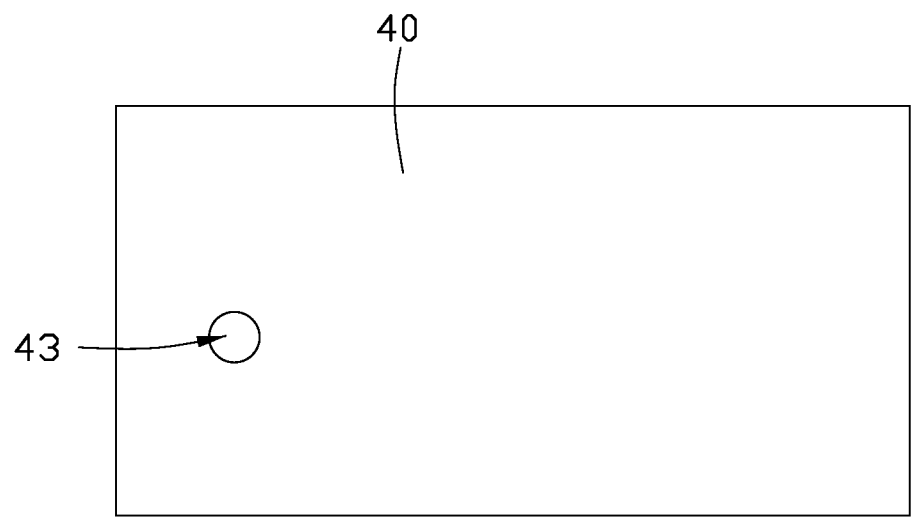
FIG. 5 is a top view of a lid of the immersion cooling device of FIG. 3.

Referring to FIG. 3, FIG. 4 and FIG. 5, the cover body 40 is detachably mounted on the box body 10. The cover body 40 defines a mounting hole 43. The protective frame includes a third rigid pipe 55. The third rigid pipe 55 is sleeved on the inlet and outlet pipes, connected to the condenser 30, and extends through the mounting hole 43. Sinc the third rigid pipe 55 is connected to the condenser 30, the third rigid pipe 55 moves with the condenser 30 when the condenser 30 moves along the slide rail 20. The third rigid pipe 55 is disposed between the condenser 30 and the cover body 40 and is used to support the inlet and outlet pipes. In some embodiments, the third rigid pipe 55 is a plastic pipe or a metal pipe, and the outer wall of the metal pipe is coated with an anti-corrosion coating.

Referring to FIG. 3 and FIG. 4, in some embodiments, the third rigid pipe 55 is rotatably mounted in the mounting hole 43. When it is necessary to move the condenser 30, first the cover body 40 is separated from the box body 10, then an external force is applied to the condenser 30 and the cover body 40 to drive the condenser 30 and cover body 40 to move from a first position to a second position, then the cover body 40 rotates 180 degrees around the inlet pipe 50, causing the cover body 40 to cover the box body 10 again. So that the cover body 40 can also be installed on the box body 10 again after the position of the condenser 30 is changed. In this case, the condenser 30 can only be located in the first or second position. In some embodiments, the cover body 40 and the box body 10 can be connected by bolts, etc. The cover body 40 is substantially rectangular or round and is matched with an opening of the box body 10.

A sealing member 70 is detachably sleeved on the third rigid pipe 55, improving the sealing performance of the third rigid pipe 55 and the cover body 40, and preventing the coolant 11 from escaping from the box body 10 when the immersion cooling device 100 is operated. The sealing member 70 is sealed from and connected between the third rigid pipe 55 and a hole wall of the mounting hole 43. In some embodiments, the sealing member 70 is a silicone ring. In other embodiments, the sealing member 70 is a sleeve made of silicone, a portion of the sealing member 70 is received in the mounting hole 43, and a portion of the sealing member 70 is exposed outside the cover body 40, so that the sealing member 70 can be easily removed before or after the cover body 40 rotates relative to the third rigid pipe 55.

In some embodiments, the inlet pipe 50 further includes a third flexible pipe 56. The third flexible pipe 56 is connected to the third rigid pipe 55 and extends through the mounting hole 43. The third flexible pipe 56 is used to protect and mount the inlet and outlet pipes extending out of the third rigid pipe 55.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. An immersion cooling device comprising:
   a box body containing coolant;
   a heat-generating component received in the box body and immersed in the coolant;
   a slide rail received in the box body, fixed to the box body and located above the coolant;
   a condenser slidably disposed on the slide rail;
   a cover body, the cover body is adapted to cover the box body and to be opened relative to the box body; and
   an inlet pipe connected to the condenser, the inlet pipe extending through and being sealed from the cover body;
   wherein the cover body comprises a first portion fixed to the box body and a second portion movably connected to the first portion, the second portion is adapted to be opened relative to the first portion, the inlet pipe is fixed to the first portion;
   the first portion defines a through hole, the inlet pipe comprises a first rigid pipe and a first flexible pipe, the first rigid pipe is fixed in and extends through the through hole, the first flexible pipe is connected between the first rigid pipe and the condenser, and a length of the first flexible pipe is greater than a distance between the condenser and the first portion.

2. The immersion cooling device of claim 1, wherein the inlet pipe further comprises a second rigid pipe, the second rigid pipe is connected between the first flexible pipe and the condenser.

3. The immersion cooling device of claim 2, further comprising a liquid collector, wherein the liquid collector is sleeved on the second rigid pipe and configured for collecting liquid from the inlet pipe.

4. The immersion cooling device of claim 3, wherein the liquid collector comprises a bottom plate and a plurality of side plates disposed on the bottom plate, the bottom plate and the plurality of side plates enclose a collecting chamber, the flexible pipe is received in the collecting chamber.

5. The immersion cooling device of claim 1, wherein the first portion and the box body are integrally formed.

6. The immersion cooling device of claim 1, wherein the first rigid pipe is a metal pipe or a plastic pipe, the first flexible pipe is a metal hose or a rubber hose.

7. The immersion cooling device of claim 1, wherein the inlet pipe further comprises a second flexible pipe connected to the first rigid pipe and located outside the box body.

8. The immersion cooling device of claim 1, wherein the cover body is detachably mounted on the box body, the cover body defines a mounting hole, the inlet pipe comprises a rigid pipe which is connected to the condenser and extends through the mounting hole.

9. The immersion cooling device of claim 8, wherein the rigid pipe is rotatably mounted in the mounting hole.

10. The immersion cooling device of claim 7, further comprising a sealing member sleeved on the rigid pipe and received in the mounting hole, wherein the sealing member is sealed from the rigid pipe and the cover body.

11. The immersion cooling device of claim 7, wherein the inlet pipe further comprises a flexible pipe connected to the rigid pipe and located outside the box body.

12. The immersion cooling device of claim 1, further comprising a protective frame, wherein the condenser is mounted on the protective frame, and the protective frame is slidably connected to the slide rail.

13. The immersion cooling device of claim 12, further comprising a stop block, wherein the stop block is disposed on the slide rail and is configured to limit a moving range of the condenser.

* * * * *